United States Patent
Rafi et al.

(10) Patent No.: US 8,503,962 B2
(45) Date of Patent: *Aug. 6, 2013

(54) IMPLEMENTING A ROTATING HARMONIC REJECTION MIXER (RHRM) FOR A TV TUNER IN AN INTEGRATED CIRCUIT

(75) Inventors: Aslamali A. Rafi, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 410 days.

This patent is subject to a terminal disclaimer.

(21) Appl. No.: 12/722,746

(22) Filed: Mar. 12, 2010

(65) Prior Publication Data
US 2010/0233987 A1    Sep. 16, 2010

Related U.S. Application Data

(63) Continuation-in-part of application No. 11/824,417, filed on Jun. 29, 2007, now Pat. No. 7,756,504.

(51) Int. Cl.
*H04B 1/26* (2006.01)
(52) U.S. Cl.
USPC .......................................... 455/302; 455/323
(58) Field of Classification Search
USPC ................ 455/205, 293, 295, 296, 302, 307, 455/315, 217, 323, 326, 330, 333, 334
See application file for complete search history.

(56) References Cited

U.S. PATENT DOCUMENTS

| | | |
|---|---|---|
| 6,049,573 A | 4/2000 | Song |
| 6,584,304 B1 | 6/2003 | Thomsen et al. |
| 6,909,882 B2 | 6/2005 | Hayashi et al. |
| 6,909,883 B2 | 6/2005 | Fujiwara |
| 6,970,688 B2 | 11/2005 | Nibe |
| 6,996,379 B2 | 2/2006 | Khorram |

(Continued)

FOREIGN PATENT DOCUMENTS

| | | |
|---|---|---|
| EP | 1 376 851 | 2/2004 |
| WO | WO 00/52819 A1 | 9/2000 |

OTHER PUBLICATIONS

Chinese Patent and Trademark Office, Office Action issued Aug. 9, 2011 in Chinese application No. 200880022673.

(Continued)

*Primary Examiner* — Thanh Le
(74) *Attorney, Agent, or Firm* — Trop, Pruner & Hu, P.C.

(57) ABSTRACT

In one embodiment, an apparatus includes mixer stages each coupled to receive a radio frequency (RF) signal from a corresponding tracking filter each configured for a band of frequencies. Each mixer stage is controllable to mix the RF signal with a divided master clock signal to obtain N multi-phase intermediate frequency (IF) signals, where N is programmable based upon a desired channel frequency. A load network having individual loads to be shared by the mixers can be coupled to the mixer stages, and a shared IF combiner may be coupled to the load network to weight and combine outputs of the load network to obtain a quadrature IF signal. The load network can include multiple loads each to be individually controlled to receive one of the multi-phase IF signals.

22 Claims, 10 Drawing Sheets

(56) References Cited

U.S. PATENT DOCUMENTS

| | | |
|---|---|---|
| 7,158,768 B2 | 1/2007 | Woo et al. |
| 7,187,913 B1 | 3/2007 | Rahn et al. |
| 7,236,212 B2 | 6/2007 | Carr et al. |
| 7,324,797 B2 | 1/2008 | Drentea |
| 7,359,678 B2 | 4/2008 | Hayashi et al. |
| 7,366,486 B2 | 4/2008 | Vorenkamp et al. |
| 7,392,026 B2 | 6/2008 | Alam et al. |
| 7,460,844 B2 | 12/2008 | Molnar et al. |
| 7,756,504 B2 | 7/2010 | Rafi et al. |
| 7,860,480 B2 | 12/2010 | Rafi |
| 7,986,926 B2 | 7/2011 | Cooley et al. |
| 8,045,943 B2 * | 10/2011 | Kaczman et al. ............ 455/293 |
| 2003/0138062 A1 | 7/2003 | Smith |
| 2005/0107055 A1 | 5/2005 | Bult et al. |
| 2006/0068746 A1 | 3/2006 | Feng et al. |
| 2006/0128334 A1 | 6/2006 | Ikuta et al. |
| 2006/0128338 A1 | 6/2006 | Kerth et al. |
| 2006/0159202 A1 | 7/2006 | Breiling |
| 2006/0286939 A1 | 12/2006 | Yamawaki et al. |
| 2007/0129034 A1 | 6/2007 | Adams et al. |
| 2007/0135074 A1 | 6/2007 | Igarashi et al. |
| 2007/0207760 A1 | 9/2007 | Kavadias et al. |
| 2008/0081568 A1 | 4/2008 | Kanaya |
| 2010/0167680 A1 * | 7/2010 | Li et al. ......................... 455/302 |
| 2010/0220878 A1 * | 9/2010 | Andersen et al. ............ 455/205 |
| 2011/0065411 A1 | 3/2011 | Rafi |

OTHER PUBLICATIONS

Jeffrey A. Weldon, et al., "A 1.75GHz Highly-Integrated Narrow-Band CMOS Transmitter With Harmonic-Rejection Mixers," Dec. 2001, pp. 2003-2015.

Raja S. Pullela, et al., "Low Flicker-Noise Quadrature Mixer Topology," 2006, pp. 1-10.

U.S. Patent and Trademark Office, Restriction Requirement mailed Jan. 6, 2010 with Response to Restriction Requirement filed Feb. 4, 2010 in U.S. Appl. No. 11/824,418.

U.S. Patent and Trademark Office, Office Action mailed Mar. 9, 2010 with Reply to Office Action filed Jun. 4, 2010 in U.S. Appl. No. 11/824,418.

U.S. Patent and Trademark Office, Notice of Allowance mailed Aug. 24, 2010 in U.S. Appl. No. 11/824,418.

U.S. Patent and Trademark Office, Office Action mailed Oct. 24, 2011 in U.S. Appl. No. 12/794,113.

U.S. Patent and Trademark Office, Office Action mailed Dec. 13, 2011 in U.S. Appl. No. 13/029,344.

U.S. Patent and Trademark Office, Notice of Allowance and Fee(s) Due dated Apr. 30, 2012 in U.S. Appl. No. 13/029,344.

Klumperink, E.A.M., "A CMOS Mixed Transconductor Mixer in: Solid-State Circuits," Aug. 2004, pp. 1231-1240.

German Patent and Trademark Office, Office Action Mailed Oct. 26, 2012 in German Application No. 11 2008 001 680.

* cited by examiner

US 8,503,962 B2

IMPLEMENTING A ROTATING HARMONIC REJECTION MIXER (RHRM) FOR A TV TUNER IN AN INTEGRATED CIRCUIT

This application is a continuation-in-part of U.S. patent application Ser. No. 11/824,417, filed Jun. 29, 2007 now U.S. Pat. No. 7,756,504, entitled "A Rotating Harmonic Rejection Mixer," the content of which is hereby incorporated by reference.

BACKGROUND

For terrestrial television (TV), signals can exist in any of multiple bands, namely very high frequency (VHF)-low, VHF-high, and ultra high frequency (UHF), collectively ranging from 54 MHz to 806 MHz, while for cable TV, signals can exist anywhere from 54 MHz to 1002 MHz. Thus a given television tuner must be designed to handle this extremely large frequency range. The tuner receives incoming signals at these high frequencies and downconverts them to a lower frequency, generally referred to as an intermediate frequency (IF) for certain signal processing. These downconverted signals are still further downconverted to baseband for further processing and demodulation to obtain audio and visual signals for output to an associated display.

To effect the downconversion, a mixer is provided that receives the incoming radio frequency (RF) signal and mixes it with a local oscillator (LO) frequency to obtain a lower frequency signal. To avoid interference with harmonics of this LO signal, a harmonic rejection mixer may be used. In U.S. Patent Application Publication No. 2009/0004993, the disclosure of which is hereby incorporated by reference, a rotating harmonic rejection mixer was disclosed, where to further reduce harmonics, the output signal of a mixer is switched among multiple IF stages, the outputs of which are summed together to generate an IF signal for further processing. The number of stages to which the IF signal is rotated can vary based upon the input signal. The rotating harmonic rejection mixer has a property of rejecting all harmonics until N−1, where N is the number of rotation stages used. While the disclosed rotating harmonic rejection mixer represents an improvement over existing harmonic rejection mixers, challenges still exist in implementing the mixer into a feasible semiconductor device.

SUMMARY OF INVENTION

According to one aspect of the present invention, an apparatus includes mixer stages each coupled to receive a radio frequency (RF) signal from a corresponding tracking filter each configured for a band of frequencies. Each mixer stage is controllable to mix the RF signal with a divided master clock signal to obtain N multi-phase intermediate frequency (IF) signals, where N is programmable based upon a desired channel frequency. A load network having individual loads to be shared by the mixers can be coupled to the mixer stages, and a shared IF combiner may be coupled to the load network to weight and combine outputs of the load network to obtain a quadrature IF signal. The load network can include multiple loads each to be individually controlled to receive one of the multi-phase IF signals.

In another implementation, an apparatus includes mixer stages each having a master RF device to receive an incoming RF signal and provide an RF current, a master local oscillator (LO) device and a rotating switch. The master LO device is coupled to an output of the master RF device to receive the RF current and mix it with a master clock signal to obtain a mixed signal. The rotating switch device is coupled to the master LO device to cyclically switch the mixed signal to one of multiple output ports to provide N multi-phase mixed signals. In turn, multiple mixer loads are each configured to be coupled to one of the output ports of an active mixer stage to perform gaining and filtering of one of the N multi-phase mixed signals. In turn, a shared IF stage is coupled to the mixer loads, and includes gain stages each coupled to one of the mixer loads to weight the output of the corresponding mixer load based on the value of N and to provide an output to a summer. The rotating switch device may have multiple slices each having a first transistor to receive the mixed signal from the second terminal of a corresponding MOSFET of the master LO device and to output a phase of the N multi-phase mixed signal when the first transistor is enabled by a rotational pulse signal of a first phase, and a second transistor to receive the mixed signal from the second terminal of another corresponding MOSFET of the master LO device and to output a phase of the N multi-phase mixed signal when the second transistor is enabled by a rotational pulse signal of a second phase. These rotational pulse signals may be AC coupled to the transistors with a programmable DC bias based on a value of N. The switching of the first and second transistors may be enabled by the rotational pulse signals when no current is present in the corresponding transistor.

Yet another aspect of the present invention is directed to a method in which an incoming RF signal is received in a mixer stage based on a frequency of the incoming signal and mixed with a master clock corresponding to a multiplied version of a LO frequency to obtain a mixed signal. The mixed signal is cyclically rotated to at least N gain stages during a LO cycle, and the outputs of the gain stages are summed to provide an output signal. When N is less than the number of gain stages, at least some of the gain stages can be disabled, and the mixed signal can be simultaneously rotated to at least two of the gain stages, where stages are programmed to have an equal gain.

DETAILED DESCRIPTION

In various embodiments a rotating harmonic rejection mixer (RHRM) may be designed to include a dedicated RF section for each of multiple bands represented by an input tracking filter. That is, a plurality of independent mixer stages may be present, each adapted to receive an incoming RF signal of a given band of a signal spectrum. For example, with reference to a TV spectrum, the TV spectrum may be segmented into a plurality of bands, e.g., Bands 1-5, each associated with a frequency range of the signal spectrum. In turn, the output of each of the independent RF sections may share a common IF section, which generally may include a load (e.g., formed of RC units) and a combiner.

Figure 1:
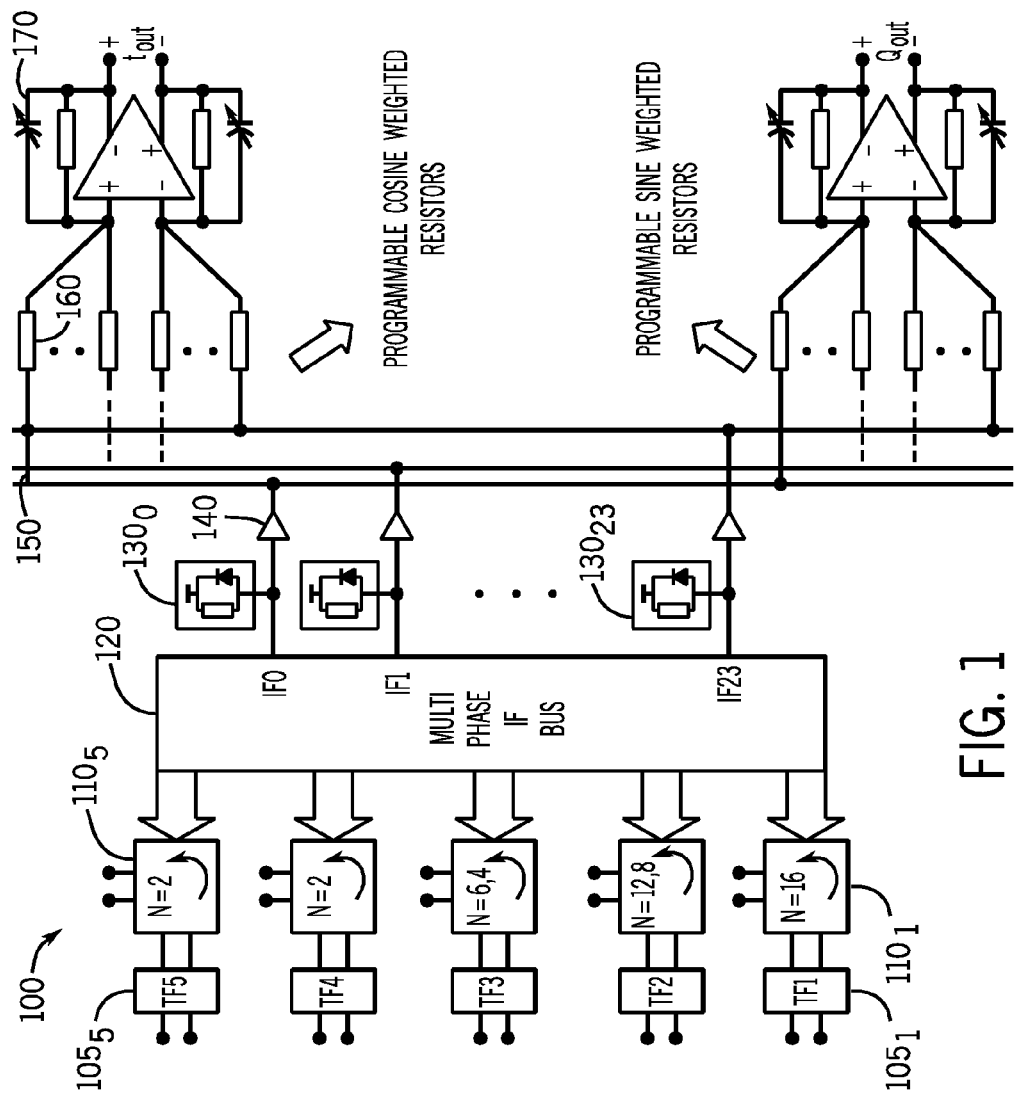
FIG. 1 is a block diagram of a rotating harmonic rejection mixer in accordance with one embodiment of the present invention.

Referring now to FIG. 1, shown is a block diagram of a rotating harmonic rejection mixer in accordance with one embodiment of the present invention. As shown in FIG. 1, mixer 100 may be formed of various stages. As seen, multiple separate RF-based mixer stages 110$_1$-110$_5$ may be provided, each of which is coupled to receive an incoming RF signal from a corresponding tracking filter 105$_1$-105$_5$, each coupled to receive an incoming RF signal of a different frequency range. Each of these mixers may be controlled to operate at a programmable value of N, namely a value of N that is selected to push out harmonics of signals within the associated band outside of the TV spectrum. N may be chosen carefully so as to avoid LO harmonics from falling into the TV band. The introduction of N=6 and N=12 in addition to N values of 2, 4, 8 and 16, may aid in pushing out the unrejected N−1th harmonics out of the TV band. The unrejected harmonic for different frequencies is as shown in Table 1, below. In addition to receiving the incoming RF signal, each RF stage is further coupled to receive a divided version of a master clock signal (MLO).

shown in FIG. 1. For harmonic rejection the outputs of each mixer stage can be weighted and summed with a different set of coefficients. Hence, the architecture of RHRM has a shared and programmable IF section, in that the gain from any output of the mixer's RF section, IF$_0$ to IF$_{N-1}$, as shown in FIG. 1, to the I output and the Q output, can be changed.

Still referring to FIG. 1, the outputs of the individual RF mixer stages may be coupled through a multi-phase IF bus 120 to a corresponding set of mixer loads 130$_0$-130$_{23}$, each of which may be formed of a RC load. In one embodiment, each RC load may be of a fixed and equal value, although in some implementations, these loads may be programmable and/or may be set to different values, e.g., based on different values of N. As an example, the capacitance of the RC load could also be made programmable to make the IF bandwidth programmable. The outputs are then passed through a corresponding set of unity gain buffers 140 and through a routing network 150, corresponding quadrature-based resistor networks 160 and through summing amplifiers 170 formed of operational amplifiers to obtain corresponding differential quadrature outputs I$_{out}$+− and Q$_{out}$+−, respectively.

The implementation shown in FIG. 1 may efficiently use chip real estate, as the IF section (generally everything after the multi-phase IF bus), can be shared by the multiple mixer stages 110. These independent mixer stages may be typically much smaller than a corresponding IF stage and thus an implementation such as set forth in FIG. 1, with independent RF mixer stages and a shared IF stage can more effectively use chip real estate. Note that while shown with this high level

TABLE 1

| Band # | RHRM Rotation (N) | Front End Div | Total Divider Value | fmax | fmin | range | Closest Unrej Harmonic (max) | Closest Unrej Harmonic (min) |
|---|---|---|---|---|---|---|---|---|
| 5 | 2 | 4 | 8 | 1,012.50 | 787.50 | 225.00 | 3,037.50 | 2,362.50 |
| 5 | 2 | 5 | 10 | 810.00 | 630.00 | 180.00 | 2,430.00 | 1,890.00 |
| 4 | 2 | 5 | 10 | 810.00 | 630.00 | 180.00 | 2,430.00 | 1,890.00 |
| 4 | 2 | 6 | 12 | 675.00 | 525.00 | 150.00 | 2,025.00 | 1,575.00 |
| 4 | 2 | 7 | 14 | 578.57 | 450.00 | 128.57 | 1,735.71 | 1,350.00 |
| 3 | 4 | 4 | 16 | 506.25 | 393.75 | 112.50 | 1,518.75 | 1,181.25 |
| 3 | 4 | 5 | 20 | 405.00 | 315.00 | 90.00 | 1,215.00 | 945.00 |
| 3 | 6 | 4 | 24 | 337.50 | 262.50 | 75.00 | 1,687.50 | 1,312.50 |
| 3 | 6 | 5 | 30 | 270.00 | 210.00 | 60.00 | 1,350.00 | 1,050.00 |
| 2 | 8 | 4 | 32 | 253.13 | 196.88 | 56.25 | 1,771.88 | 1,378.13 |
| 2 | 8 | 5 | 40 | 202.50 | 157.50 | 45.00 | 1,417.50 | 1,102.50 |
| 2 | 12 | 4 | 48 | 168.75 | 131.25 | 37.50 | 1,856.25 | 1,443.75 |
| 2 | 12 | 5 | 60 | 135.00 | 105.00 | 30.00 | 1,485.00 | 1,155.00 |
| 1 | 16 | 4 | 64 | 126.56 | 98.44 | 28.13 | 1,898.44 | 1,476.56 |
| 1 | 16 | 5 | 80 | 101.25 | 78.75 | 22.50 | 1,518.75 | 1,181.25 |
| 1 | 16 | 6 | 96 | 84.38 | 65.63 | 18.75 | 1,265.63 | 984.38 |
| 1 | 16 | 7 | 112 | 72.32 | 56.25 | 16.07 | 1,084.82 | 843.75 |
| 1 | 16 | 8 | 128 | 63.28 | 49.22 | 14.06 | 949.22 | 738.28 |
| 1 | 16 | 10 | 160 | 50.63 | 39.38 | 11.25 | 759.38 | 590.63 |

In Table 1, wherever there is an overlap of possible LO frequencies between two adjacent rows, i.e., an LO frequency can be synthesized using two different values of N, then the higher value of N is chosen to generate that particular LO frequency. This ensures that the unrejected harmonic is at a higher frequency and outside the TV spectrum.

The frequencies of operation of each RHRM can be chosen to overlap the frequency range of the tracking filter coupled in front of the mixer. In one embodiment, a 7.2 GHz VCO may be used with a tuning range of +−12.5% and having a front end division ratio of 4, 5, 6, 7, 8 and 10 and thus the values of N can be so chosen to avoid LO harmonics lying within 1 GHz. Each RF mixer stage operates with a different N, as view in the implementation of FIG. 1, further details and variations are possible, some of which are discussed further below.

Because each independent mixer stage may have a different rotation number N, different portions of the shared IF network may be selectively controlled based on the active RF mixer. This control may take various forms. For example, in different implementations, differing amounts of loads and resistors may be enabled/disabled and/or have their gains controlled accordingly. This is so, as the IF outputs are shared amongst different mixers, and the number of distinct IF outputs from an active mixer stage is equal to the RHRM rotation N. Thus if RHRM rotation of a first mixer stage was equal to N there would be N distinct IF outputs (each of a different phase relationship with respect to the other). But if RHRM rotation changes, to N/2 for example, then so should the number of distinct outputs also change. There are physically N distinct RC filters. In this example, now each set of two IF outputs carries a distinct IF phase. Thus if RHRM rotation became N/2, there would be N/2 pairs of distinct IF outputs. As N for the mixer changes from N=16 to 8 to 4, this grouping of mixer outputs enables keeping the same DC level at the mixer output as the same DC current is rotated amongst the same total load resistance, keeping approximately the same single-ended gain of the mixer, and keeping approximately the same random HR as N changes.

Note that the rotational switches of the RHRM may suffer from noise. Further note that each member of a group carries the same phase of IF signal. If the gain from each member of a group to the output is not the same, then the noise in the rotational switches of the RF section of the mixer that normally does not appear at the output could appear that the output and degrade the noise performance. To avoid such noise, each member of a group can be made to see the same gain to the output in RHRM architecture.

Grouping of IF signals and relative gains from each IF output ($IF_0$ to $IF_{N-1}$ of FIG. 1) to the final quadrature outputs, $I_{out}$ and $Q_{out}$, is shown in Table 2.

TABLE 2

| Program. | 2p-7 | 2P-5 | 4-P | 6-P | 8-P | 12-P | 16-P | |
|---|---|---|---|---|---|---|---|---|
| | | | | I | | | | |
| 6, 0 | 0 | 0 | 0 | 6.2 | 0 | 6.2 | 0 | if0 |
| 6, 9, 0 | 0 | 0 | 0 | 6.2 | 0 | 6.2 | 9.2 | if1 |
| 17 | | | | | 17 | 17 | | if2 |
| 17 | | | | | 17 | 17 | 17 | if3 |
| 23, 24, 21 | 23 | 21 | 24 | 23.2 | | 23.2 | | if4 |
| 22, 23, 24, 21 | 23 | 21 | 24 | 23.2 | | 23.2 | 22.2 | if5 |
| 23, 24, 21 | 23 | 21 | 24 | 23.2 | 24 | 23.2 | 24 | if6 |
| 22, 23, 24, 21 | 23 | 21 | 24 | 23.2 | 24 | 23.2 | 22.2 | if7 |
| 17 | | | | | 17 | 17 | | if8 |
| 17 | | | | | 17 | 17 | 17 | if9 |
| -6, 6, 0 | 0 | 0 | 0 | -6.2 | | 6.2 | | if10 |
| -6, 6, 9, 0 | 0 | 0 | 0 | -6.2 | | 6.2 | 9.2 | if11 |
| -6, 0 | 0 | 0 | 0 | -6.2 | 0 | -6.2 | 0 | if12 |
| -6, -9, 0 | 0 | 0 | 0 | -6.2 | 0 | -6.2 | -6.2 | if13 |
| -17 | | | | | -17 | -17 | | if14 |
| -17 | | | | | -17 | -17 | -17 | if15 |
| -23, -24, -21 | -23 | -21 | -24 | -23.2 | | -23.2 | | if16 |
| -22, -23, -24, -21 | -23 | -21 | -24 | -23.2 | | -23.2 | -22.2 | if17 |
| -23, -24, -21 | -23 | -21 | -24 | -23.2 | -24 | -23.2 | -23 | if18 |
| -22, -23, -24, -21 | -23 | -21 | -24 | -23.2 | -24 | -23.2 | -22.2 | if19 |
| -17 | | | | | -17 | -17 | | if20 |
| -17 | | | | | -17 | -17 | -17 | if21 |
| -6, 0, 6 | 0 | 0 | 0 | 6.2 | | -6.2 | | if22 |
| 6, -6, -9 | 0 | 0 | 0 | 6.2 | | -6.2 | -9 | if23 |

TABLE 2-continued

| | Q | | | | | | | Program. |
|---|---|---|---|---|---|---|---|---|
| | 16-P | 12-P | 8-P | 6-P | 4-P | 2-P5 | 2P-7 | |
| if0 | 24 | 23.2 | 24 | 23.2 | 24 | 29 | 29 | 23, 24, 29 |
| if1 | 22.2 | 23.2 | 24 | 23.2 | 24 | 29 | 29 | 22, 23, 24, 29 |
| if2 | | 17 | 17 | | | | | 17, -17 |
| if3 | 17 | 17 | 17 | | | | | 17, -17 |
| if4 | | 6.2 | | 6.2 | 0 | 0 | 0 | 6, 0 |
| if5 | 9.2 | 6.2 | | 6.2 | 0 | 0 | 0 | 6, 9, 0 |
| if6 | 0 | -6.2 | 0 | 6.2 | 0 | 0 | 0 | 6, -6, 0 |
| if7 | -9.2 | -6.2 | 0 | 6.2 | 0 | 0 | 0 | 6, -6, -9, 0 |
| if8 | | -17 | -17 | | | | | -17 |
| if9 | -17 | -17 | -17 | | | | | -17 |
| if10 | | -23.2 | | -23.2 | -24 | -29 | -29 | -23, -24, -29 |
| if11 | -22.2 | -23.2 | | -23.2 | -24 | -29 | -29 | -22, -23, -24, -29 |
| if12 | -24 | -23.2 | -24 | -23.2 | -24 | -29 | -29 | -23, -24, -29 |
| if13 | -22.2 | -23.2 | -24 | -23.2 | -24 | -29 | -29 | -22, -23, -24, -29 |
| if14 | | -17 | -17 | | | | | -17, 17 |
| if15 | -17 | -17 | -17 | | | | | -17, 17 |
| if16 | | -6.2 | | -6.2 | 0 | 0 | 0 | -6, 0 |
| if17 | -9 | -6.2 | | -6.2 | 0 | 0 | 0 | -6, -9, 0 |
| if18 | 0 | 6.2 | 0 | -6.2 | 0 | 0 | 0 | 6, -6, 0 |
| if19 | 9.2 | 6.2 | 0 | -6.2 | 0 | 0 | 0 | 6, -6, 9, 0 |
| if20 | | 17 | 17 | | | | | 17 |
| if21 | 17 | 17 | 17 | | | | | 17 |
| if22 | | 23.2 | | 23.2 | 24 | 29 | 29 | 23, 24, 29 |
| if23 | 22.2 | 23.2 | | 23.2 | 24 | 29 | 29 | 23, 24, 29 |

Each row of Table 2 represents the signal at one of the mixer's load filters 130 ($IF_0$ to $IF_{N-1}$ of FIG. 1). In the embodiment of Table 2 there are 24 load RCs in the RHRM architecture. The number of each column represents the relative gain from a particular mixer's load RC to the final $I_{out}$ and $Q_{out}$ output from mixer 100. The left half of Table 2 represents the gains to the I output and the right half of Table 2 represents the gains to the Q output. Each column corresponds to a given RHRM rotation N. Thus 6-P, 8-P, 12-P and 16-P stand for N=6, 8, 12 and 16 respectively, while 2P-7 and 2P-5 correspond to values of N=2, with different front end division ratios of the master clock (i.e., 7 and 5, respectively). A blackened cell in Table 2 signifies that that particular load RC is not used and carries no signal for that particular value of N. Along a column, each group of IF stages is separated from the other by a solid line. As seen in Table 2, all members of a group all have the same gain. As seen, for N=2, 4 the same numbers in the groupings are used. For N=2, even though the MLO frequency is 2 times that of the LO frequency desired, both rising and falling edges of MLO are used to generate 4 multiphase outputs. But for N=4, MLO frequency is 4 times that of the LO frequency but only the rising edge of MLO is used to generate the 4 multiphase outputs. Note that N=2,4 are both non-HRM but rotational. The relative gains are chosen to give both harmonic rejection for any of the quadrature outputs ($I_{out}$ or $Q_{out}$) and to provide image rejection for $I_{out}$ and $jQ_{out}$.

Thus by grouping of the load RCs carrying the same phase of IF signals, the area consuming RC filters for mixers with different N can be re-used, leading to significant area savings. Furthermore, the unity gain buffers, resistors, and the operational amplifiers used to generate $I_{out}$ and $Q_{out}$ can be re-used for different N, thereby saving area and also, programming different relative gains for different N is easily accomplished in the low frequency IF section of the mixer.

As shown in FIG. 1, the tuning ranges of a certain tracking filter may dictate that different values of N be used in the same mixer, e.g., depending on desired channel frequency. For example for mixer stage $110_3$ corresponding to tracking filter $105_3$, N=4 and N=6 can be used in the same mixer. Likewise, for tracking filter $105_2$ N=12 and 8 are to be used in the same mixer. This selection can be accomplished by not using some of the rotational switches in the 8-phase mode when compared with the 12-phase mode. Control of which IF paths are to be enabled/disabled, as well as weighting, can be based on control signals from a microcontroller or other logic (not shown in FIG. 1). These control signals may be generated based on information in a lookup table that is accessed based on a frequency of a desired channel.

Figure 2:
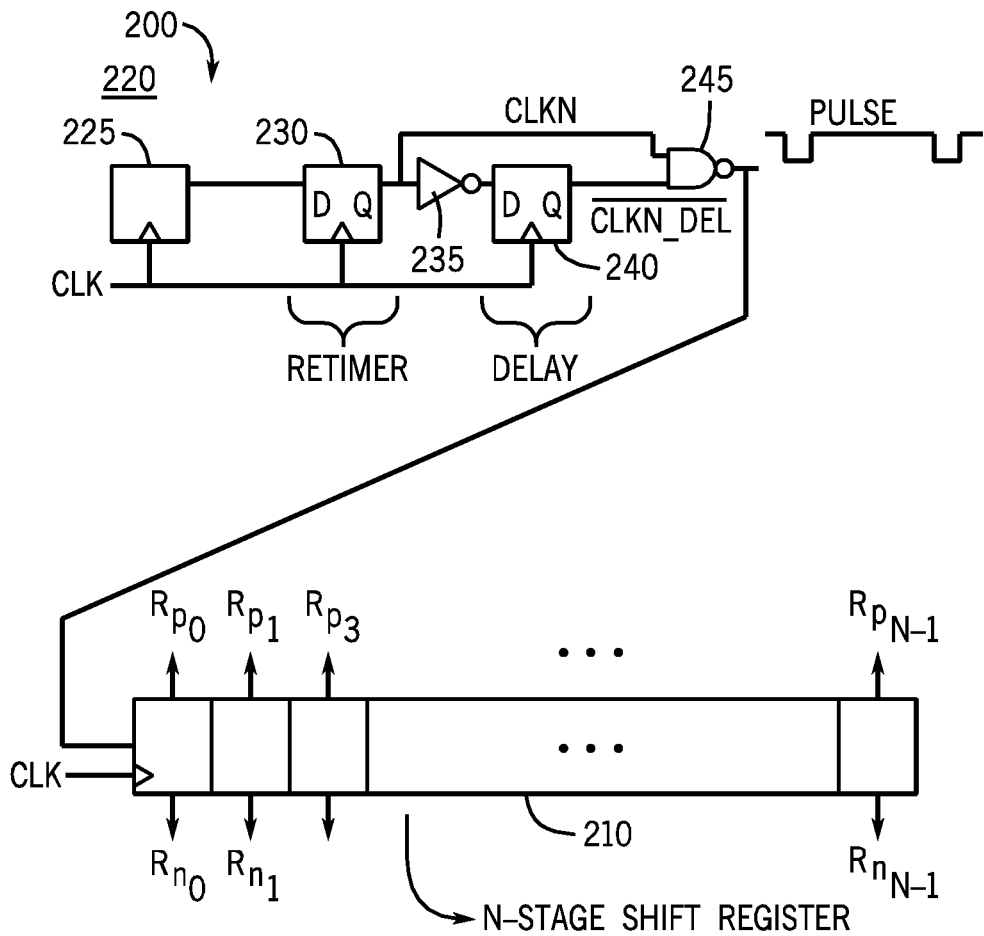
FIG. 2 is a block diagram of a rotational pulse generator in accordance with an embodiment of the present invention.
Figure 3:
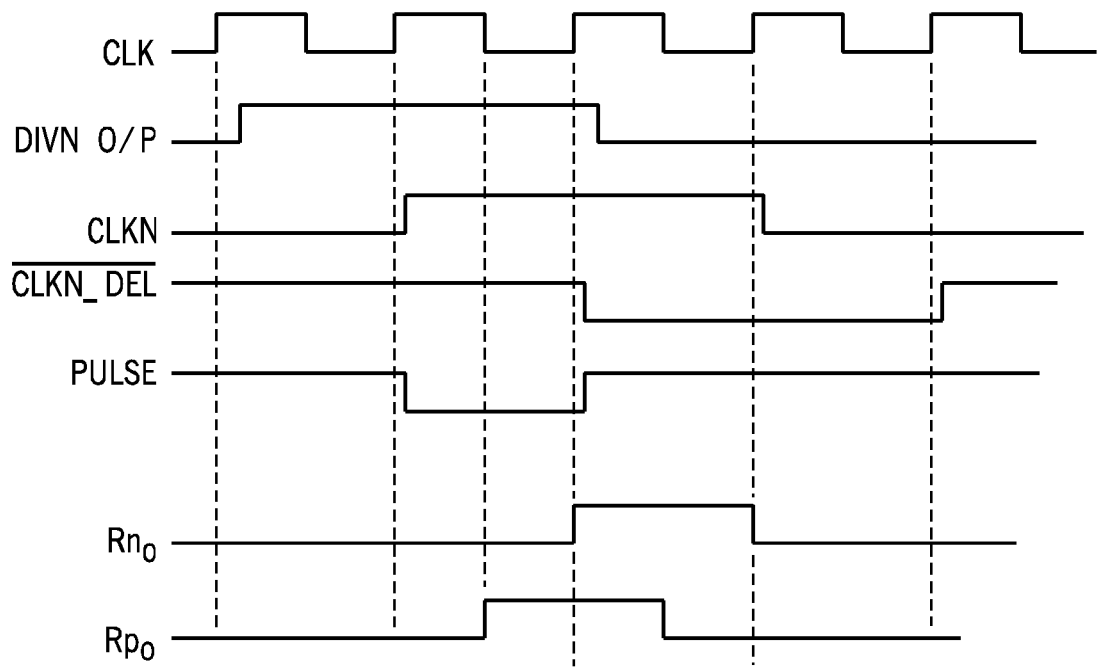
FIG. 3 is a timing diagram of various signals in accordance with one embodiment of the present invention.

Various approaches to the generation of rotational pulses may be used, including a Grey coded counter and decoder, a shift register with set/reset, or a counter followed by a shift register. In one embodiment, the counter approach may be chosen primarily because of its low power nature and relative simplicity. Referring now to FIG. 2, shown is a block diagram of a rotational pulse generator in accordance with an embodiment of the present invention. As shown in FIG. 2, pulse generator 200 may generate the rotational pulses used to provide the different phases of mixer outputs to the IF network. As seen in the embodiment of FIG. 2, a shift register 210, which may be an N-stage shift register receives a clock signal (CLK), which may be at the MLO, and a pulse output from a pulse generator circuit 220. Each stage of the shift register may generate rotational pulse signals both on a falling edge and rising edge of the clock. In one embodiment, the N-stage shift register can be made of N master-slave D flip-flops. The signals $Rp_0$, $Rp_1$, $Rp_{n-1}$ are generated from the falling edge of the clock while the signals $Rn_0$, $Rn_1$, $Rnn_{-1}$ are generated from the rising edge of the clock, and the pulse widths of either Rp* or Rn* are equal to one time period of the incoming clock, thus satisfying the requirements for rotational pulses of the RHRM. As seen, pulse generator circuit 220 may be formed of a series set of a Count-till-N (block 225) and D type flip-flops, including a first flip-flop 230 coupled to a second flip-flop 240. The first flop 230 retimes the output of the count-till-N block and the second flop 240 delays the inverted output of 230. As seen in FIG. 2, the Q outputs of the first and second flip-flops may be logically combined in a NAND gate 245 to generate a pulse signal, as shown in FIG. 2. While shown with this particular implementation in the embodiment of FIG. 2, understand that the scope of the present invention is not limited in this regard. A timing diagram representing the various signals used in pulse generator 200 is shown in FIG. 3.

Figure 4:
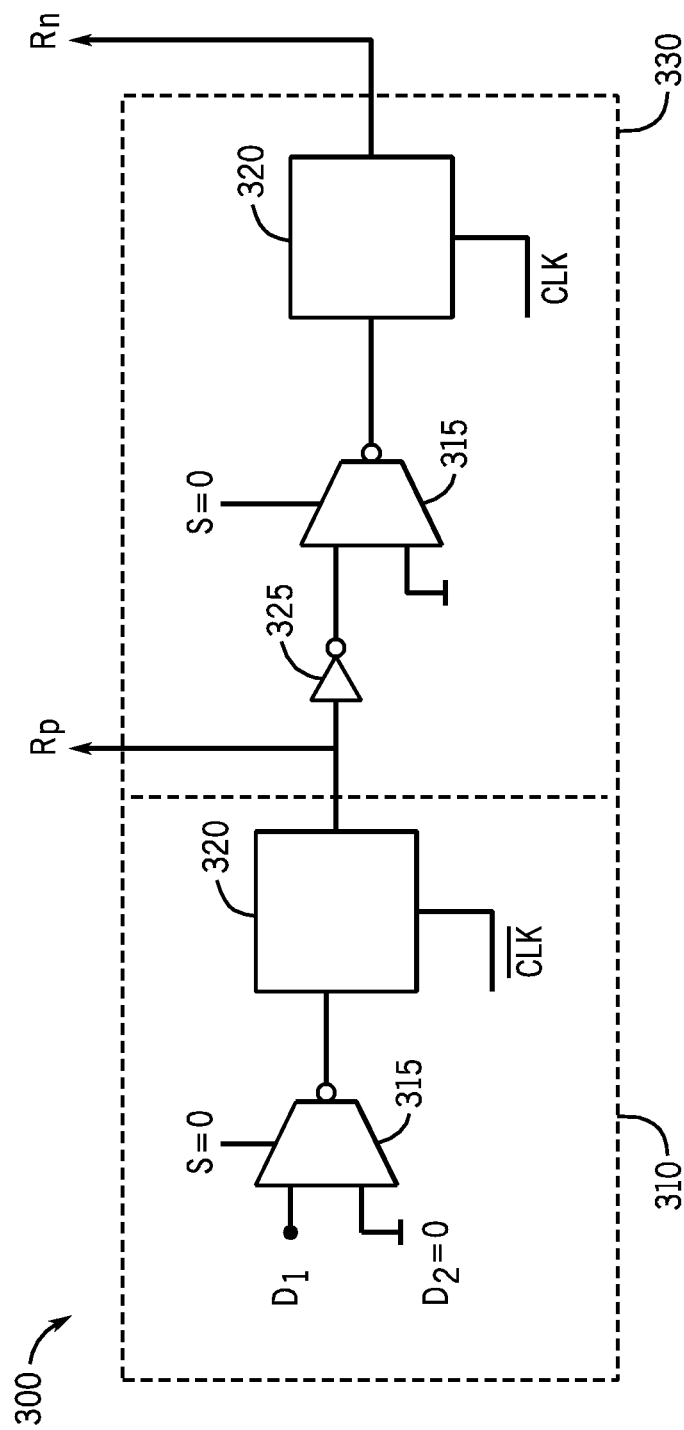
FIG. 4 is a block diagram of an implementation of one bit of a shift register in accordance with an embodiment of the present invention.

Referring now to FIG. 4, shown is a block diagram of an implementation of one bit of a shift register in accordance with an embodiment of the present invention. As shown in FIG. 4, stage 300 may represent one cell or bit of the shift register. As seen, each bit may be formed of a master half 310 and a slave half 330. Each half of the flip-flop may include a corresponding input multiplexer 315 and a corresponding latch 320. Note that the slave latch further includes an inverter 325 to invert the output of the previous latch 320. As seen, each of the latches may be individually controlled by the opposite phases of the clock signal. Using the input multiplexers, the width of the shift register may be adjustably controlled. This may enable control of the mixer to allow a single RF mixer stage to operate with two different values of N. For example, in the case of multiplexing 8 and 12 phase modes in one mixer, the length of the shift register may be modified such that in the 8 phase mode, the shift register can only have 8 operational stages instead of 12. This can be accomplished by bypassing the outputs of unoperational flip-flops and taking the input from the previous operational flip flop, e.g., using the multiplexers in the flip-flop topology.

Figure 5:
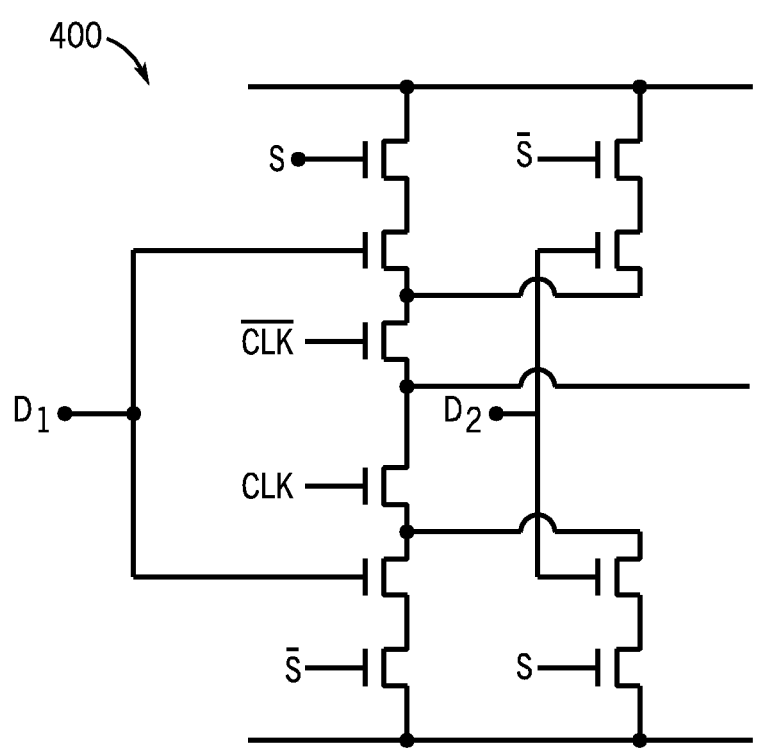
FIG. 5 is a block diagram of multiplexers embedded into a latch topology in accordance with one embodiment of the present invention.

In the circuit level implementation, these multiplexers can be embedded into the latch topology to enable higher speed operation, as shown in FIG. 5. Specifically, the dynamic latch is formed by MOSFETs gated by opposite clock signal phases. One portion of the multiplexer is formed by NMOS and PMOS devices gated by S and its complement, while the other portion of the multiplexer is formed by NMOS and PMOS devices gated by $\overline{S}$ and S respectively. When S is low, the input D1 is selected and if S is high, the input D2 is selected. While shown with a latch-type implementation having an integrated multiplexer, understand that other manners of generating rotational pulses can be realized.

The architecture of the RHRM provides for rotational pulses of relatively small duty cycle which is a function of N, i.e., 1/N. While AC coupling these narrow pulses to the rotational switches can be of reduced complexity and lower power as compared to a DC coupling implementation, one of the concerns is that the DC value of these pulses changes with N. Further, the architecture of the RF section of the mixer is sensitive to the maximum value of the coupled rotational pulse. So if the rotational pulse is AC coupled and the DC bias remains unchanged as N changes, this would imply that the maximum value of the coupled signal also changes with N. This may consume voltage headroom available in the mixer. Accordingly in various embodiments the DC bias for an AC coupling implementation can be programmed so as to ensure that the maximum of the rotational pulse coupled to the mixer remains independent of N to first order.

Figure 6:
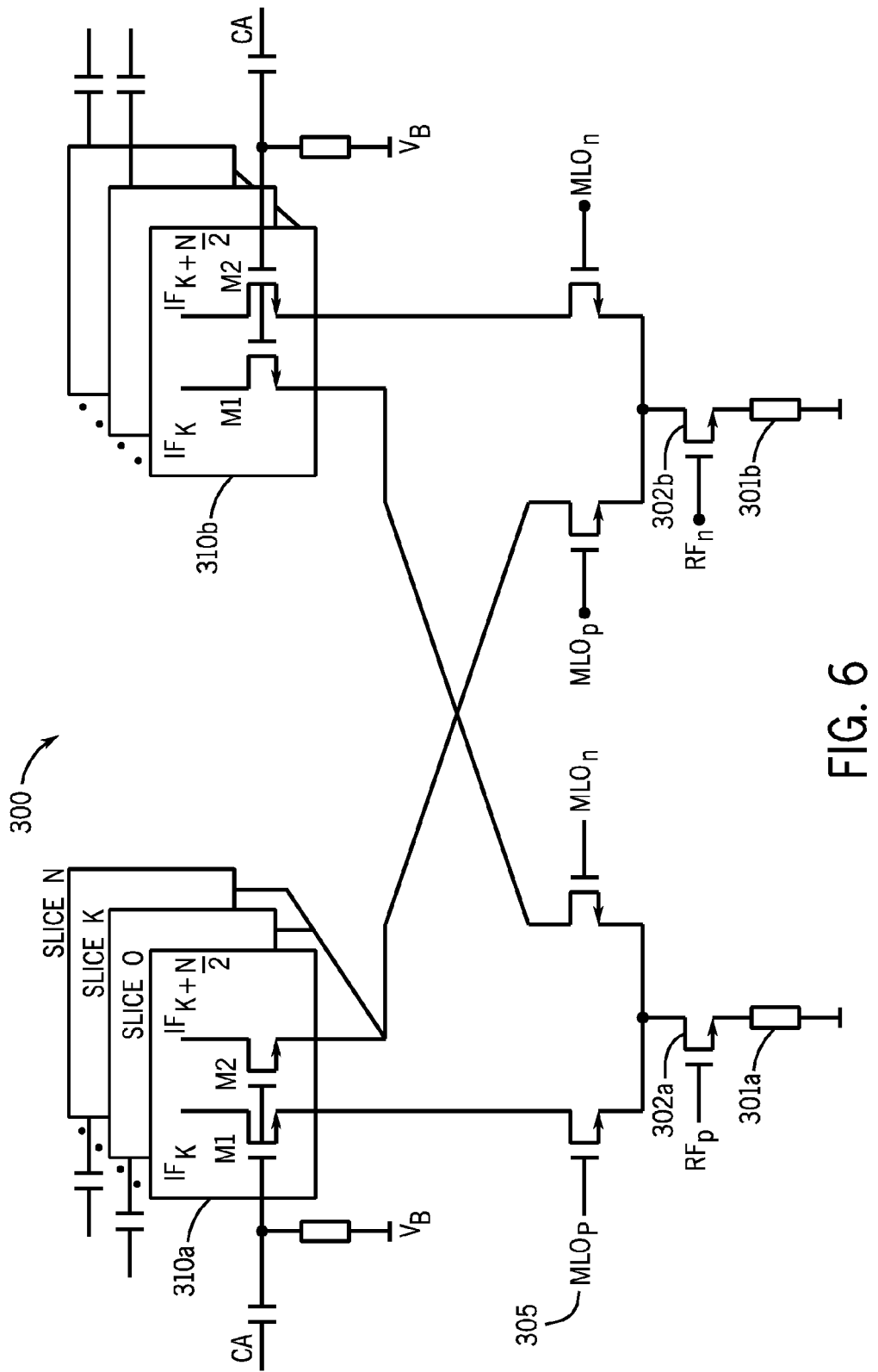
FIG. 6 is a block diagram of an implementation of AC coupling of clock signals to a mixer in accordance with an embodiment of the present invention.

Referring now to FIG. 6, shown is a block diagram of an implementation of AC coupling of clock signals to a mixer in accordance with an embodiment of the present invention. As shown in FIG. 6, mixer 300 receives incoming RF signals at respective gates of MOSFETs $302_a$ and $302_b$, each of which is configured as a transconductor to receive a polarity of the RF signal at its gate terminal, and having a source terminal coupled to ground via a resistance $301_a$ and $301_b$, respectively and having drain terminals coupled to an RF mixer stage 305. As seen the RF stage 305 is formed of a pair of MOSFETs having source terminals to receive the incoming RF signal and gated by different phases of the master clock signal (respectively MLO and $MLO_N$). In the implementation of FIG. 6, the outputs of RF mixer stage 305 are double balanced such that the respective outputs are provided to corresponding slices $310_a$ and $310_b$, which in turn switch the incoming signals through to the various mixer loads (not shown for ease of illustration in FIG. 6) via rotational pulses (e.g., N pulses per period of LO).

As further seen in FIG. 6, each slice 310 is coupled to receive a rotational pulse via an AC coupling mechanism including a capacitor $C_A$ that is coupled to gate terminals of the corresponding MOSFETs M1 and M2 of the slice. Note that each MOSFET M1 and M2 has a source terminal coupled to the same phase outputs of mixer stage 305. In turn, the drain terminals of M1 and M2 are provided to a corresponding mixer load (not shown in FIG. 6). As further seen, a controllable bias voltage $V_B$ may be applied to a bias resistor $R_B$ similarly coupled to the gate terminals. In this way, by adjusting the bias voltage as N changes, a maximum of the rotational pulse provided to the various slices remains independent of N. Further, by configuring the mixer as a double balanced mixer, any noise can be canceled as common mode noise. In this way, any noise of DC biasing via resistor $R_B$ for each rotational slice appears as common mode noise that can be canceled.

Using an implementation such as FIG. 6, noise concerns with AC coupling can be resolved. That is, for a single balanced mixer, the noise contribution of a DC biasing resistor can be significant. But its noise can be cancelled by an appropriate configuration of the mixer. In this implementation, the noise of DC biasing resistor is cancelled as common mode noise. By AC coupling rotational pulses, lower power can be realized and the RF section can have much reduced complexity.

Spurious concerns may also exist in a mixer design. For a RHRM, the phase difference between consecutive IF outputs, $IF_k$ and $IF_{k+1}$, is determined by the time difference between consecutive edges of the master clock (MLO). This time difference is unaffected by device matching. However, anything that affects the time difference between consecutive edges of MLO could in theory affect the HR performance of the mixer. Suppose the rotational LO is coupled to the MLO power supply. Then the rise/fall times at the outputs of the drivers of the MLO could be affected by rotational LO activity, which in turn can affect the time difference between consecutive edges of MLO.

Figure 7:
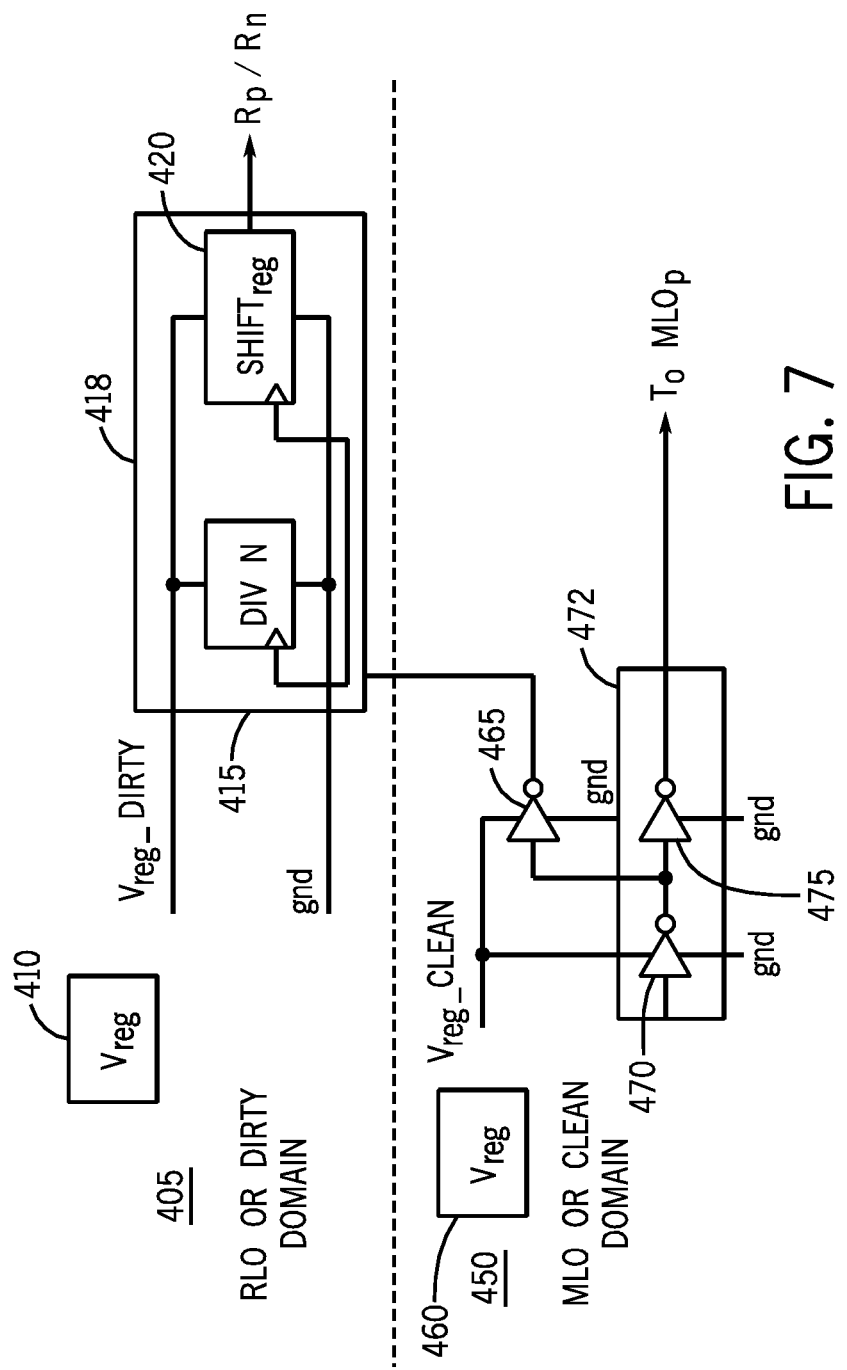
FIG. 7 is a block diagram of a partitioned power supply arrangement in accordance with an embodiment of the present invention.

To avoid this situation, in some embodiments a power supply can be partitioned with different power supply regulators used for drivers of rotational (dirty) and master LO (clean) signals. Referring now to FIG. 7, shown is a block diagram of a partitioned power supply arrangement in accordance with an embodiment of the present invention. As shown in FIG. 7, mixer 400 includes separate domains, namely a dirty domain 405 from which rotational pulses may be generated and a clean domain 450 from which the master clock signals (MLO) may be generated. Specifically, domain 405 includes a voltage regulator 410 which may provide a dirty regulated voltage to various components of a pulse generator 418 used to generate the rotational pulses, including a clock divider 415 and a shift register 420. Thus in this implementation, the rotational pulses may be generated using a dirty regulated voltage, in that the voltage may have some amount of noise. In contrast, for generation of the master clock signal MLO, a clean regulated voltage generated by voltage regulator 460 may be provided, i.e., lacking any measurable noise. Specifically, a buffer 472 formed of a series of inverters 470 and 475 may be powered by this clean voltage to buffer the master clock signal for output to the RF mixer stages. In addition, another inverter 465 also coupled to inverter 470 may provide the master clock signal as a reference for clock divider 415.

Figure 8:
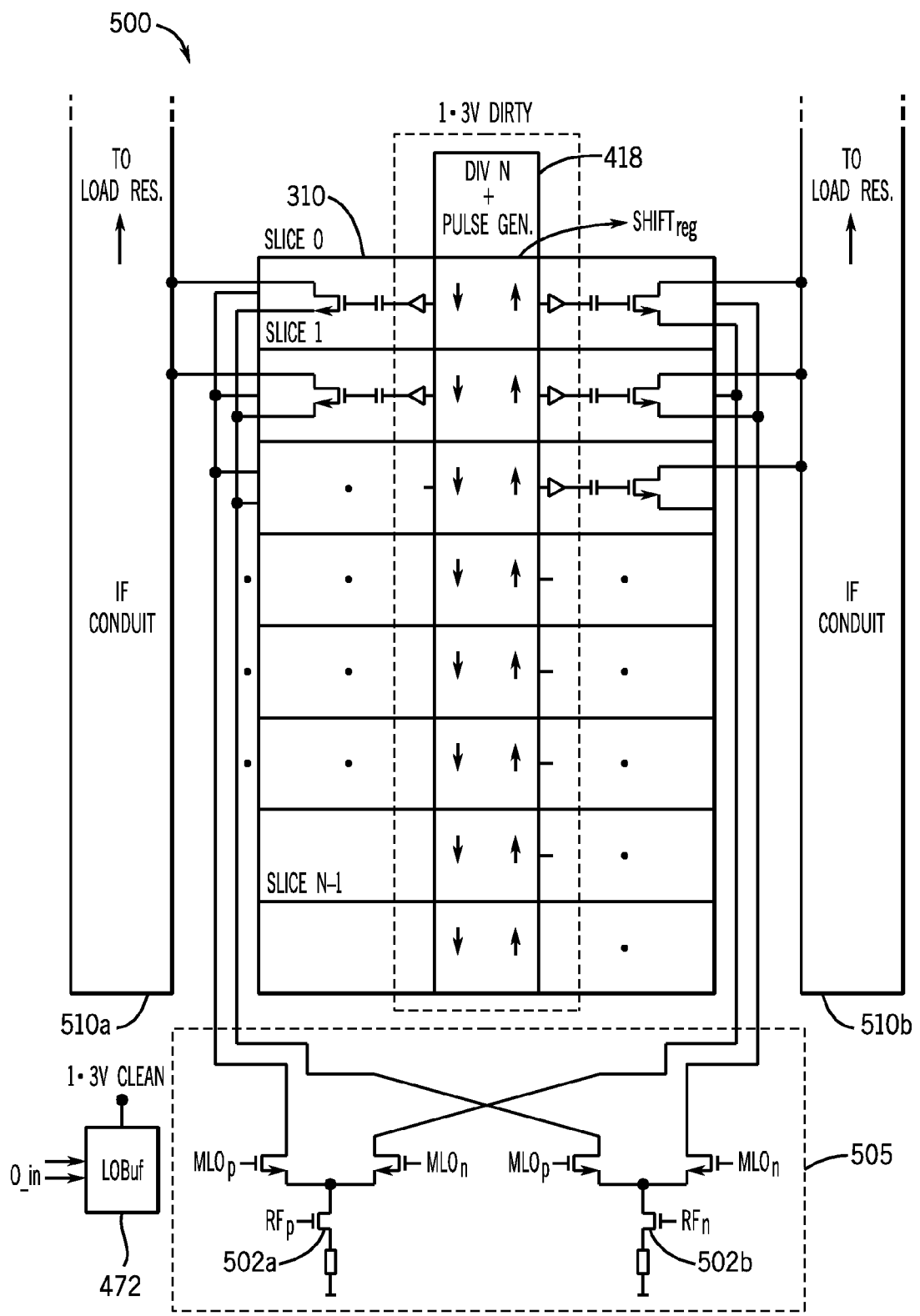
FIG. 8 is a floorplan of a RF section of a mixer in accordance with one embodiment of the present invention.

Referring now to FIG. 8, shown is a floorplan of a RF section of a mixer in accordance with one embodiment of the present invention. As shown in FIG. 8, the RF section includes transconductors 502 coupled to receive the incoming RF signal and provide it to the RF mixer 505, which may be adapted as a double balanced mixer similar to that shown above regarding mixer stage 305 in FIG. 6. In turn, the multiplied RF signal may be routed through corresponding slices 310, each of which receives rotational pulses corresponding to a divided version of the master clock signal, either on the rising edge or falling edge of the divided signal. The resulting output signals are then provided through corresponding IF conduits $510_a$ and $510_b$ to the load RCs (not shown in FIG. 8), but which may be generally configured such as shown in FIG. 1 discussed above. In FIG. 8, an up arrow indicates that the output of the particular latch changes at the rising edge of $MLO_p$, and a down arrow indicates that the output is changing at the rising edge of $MLO_n$. To further avoid any spurious RF coupling, each rotational slice may be configured in a metallic shield or cage of its own.

Figure 9:
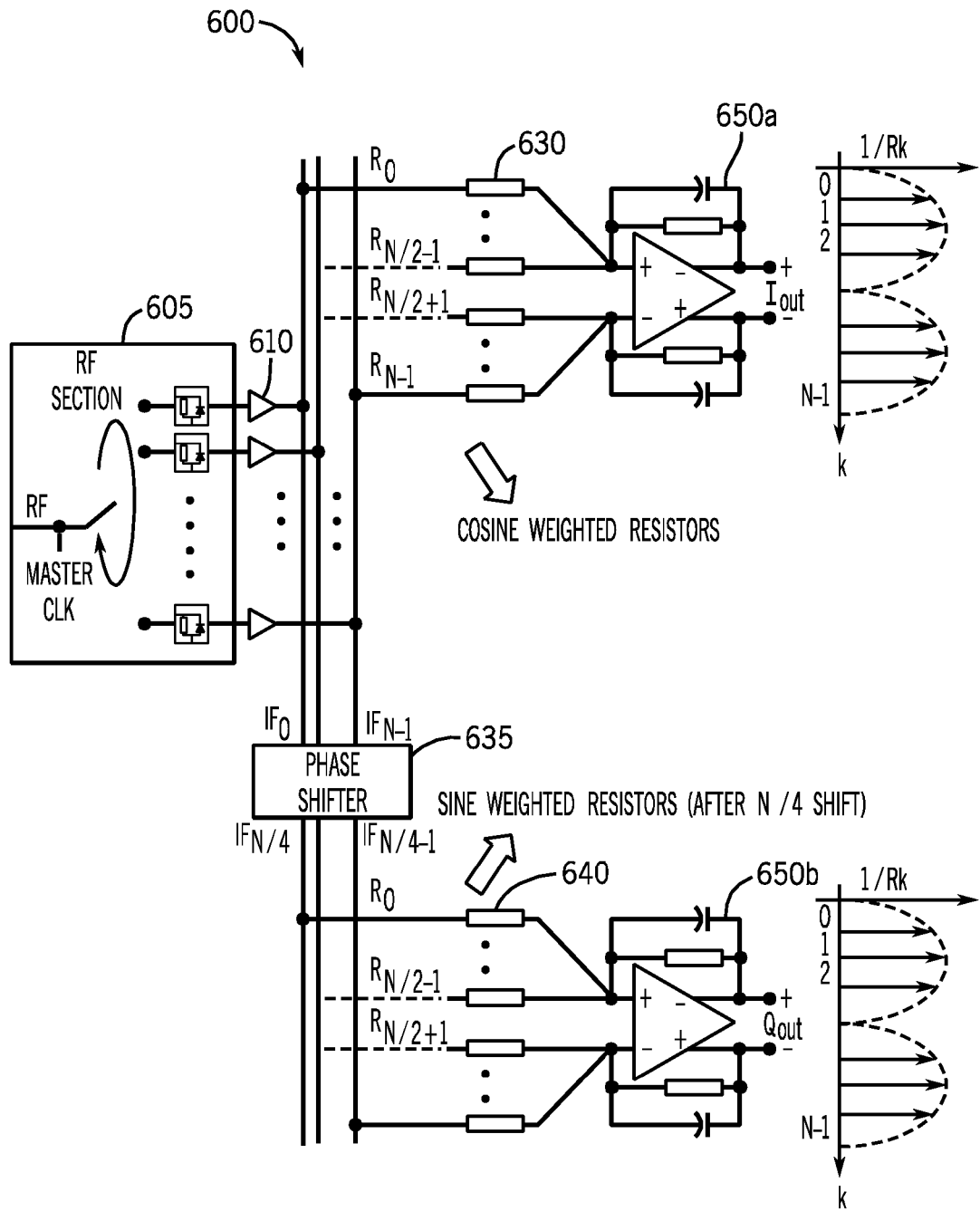
FIG. 9 is a block diagram of an IF combiner in accordance with an embodiment of the present invention.

After being provided to the mixer loads, the IF signals may be routed through unity gain buffers and to corresponding sets of weighted resistors. FIG. 9 is a block diagram of an IF combiner in accordance with an embodiment of the present invention. The purpose of the IF combiner is to weight the multi-phase signals $IF_0$ to $IF_{N-1}$ generated by the RF section 605 of the mixer (note only one mixer stage is shown in FIG. 9), proportional to sine wave coefficients and to sum them to generate the final $I_{out}$ and $Q_{out}$. IF combiner 600 generally includes unity gain buffers 610, summing resistors 630, 640 and operational amplifiers $650_a$ and $650_b$ each having an RC network coupled across it. These operational amplifiers may act to sum the inputs through each set of summing resistors to thus obtain a differential quadrature output. Specifically, as shown in FIG. 9, the IF outputs from the slices of FIG. 8 may be provided to mixer's RC loads and then through buffers 610 and multi-phase bus 620 to corresponding cosine weighted resistors 630, while in turn the IF outputs may first pass through a phase shifter 635 before being provided to sine weighted resistors 640. The unity gain buffers can be reused for different N, leading to area savings, and the summing resistors are programmable for different N.

Figure 10:
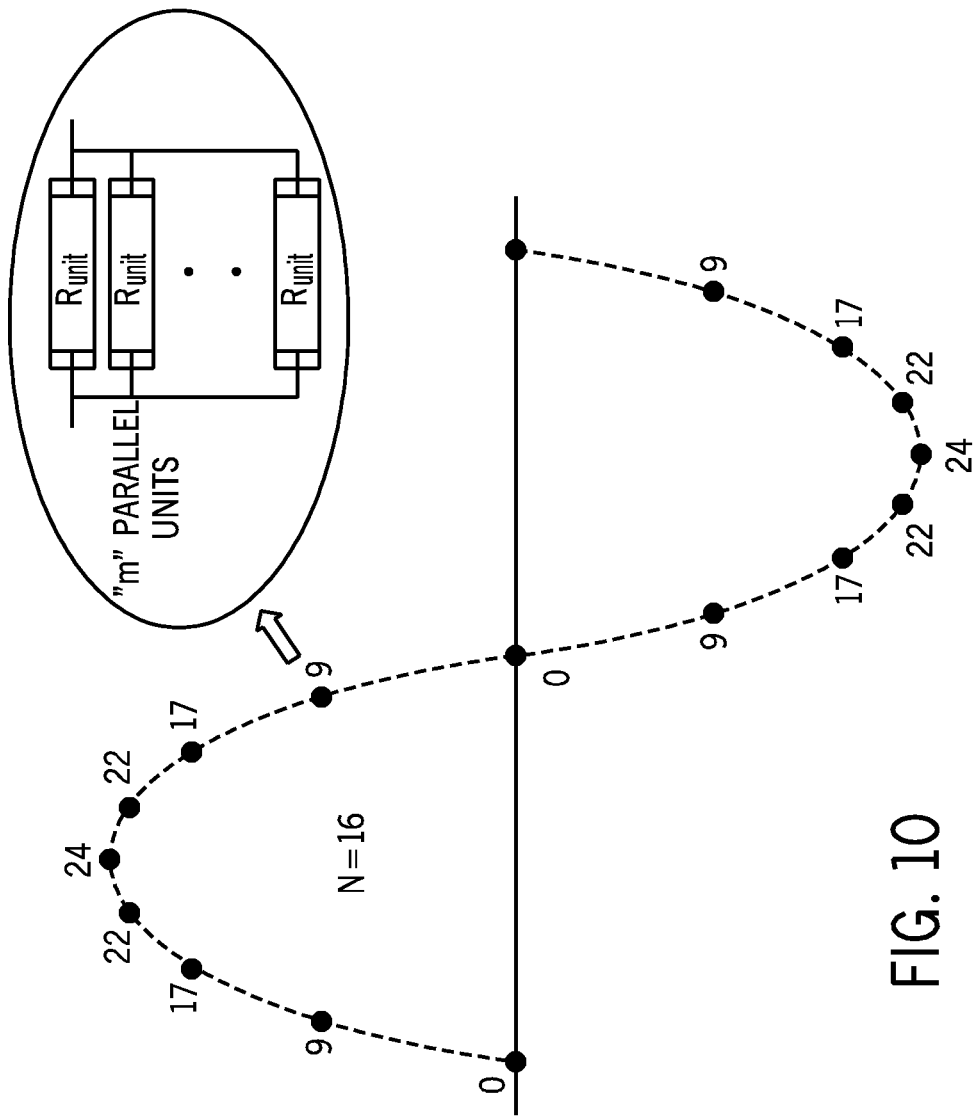
FIG. 10 is block diagram of a programmable resistor in accordance with one embodiment of the present invention.

The sine/cosine wave coefficients used in one implementation are in accordance with Table 2 above. The weighting by sine wave coefficients can be accomplished through the summing resistors, which are implemented as an integer number of parallel unit resistors. For example, for a N-weight unit, N parallel resistors of the unit value may be present. This approach makes the relative ratio of any two sine wave coefficients exact and immune to modeling deficiencies. The fractional part of the weights can be implemented by using the unit resistor in series. For example, a plurality of unit resistors (a number of which depends on desired weights) can be provided and which are controlled as a single unit to either be on or off. Referring now to FIG. 10, shown is block diagram of a programmable resistor in accordance with one embodiment of the present invention. As seen in FIG. 10, a plurality of parallel resistors units may be coupled between an input node and an output node, each of which has a unit resistance value, ($R_{unit}$). While not shown for ease of illustration, each resistor may be individually controlled (e.g., via MOSFET switches) to be selectively coupled or decoupled between the input and output nodes, based on a selected weight of the given summing resistor. FIG. 10 also shows a resulting sine wave via a summing of the outputs of the different resistors for an implementation of N equal to 16.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a plurality of mixer stages each coupled to receive a radio frequency (RF) signal from a corresponding tracking filter each configured for a band of frequencies, each mixer stage controllable to mix the RF signal with a divided master clock signal to obtain N multi-phase intermediate frequency (IF) signals, wherein N is programmable based upon a frequency of a desired channel;
   a load network having a plurality of individual loads to be shared by the plurality of mixers; and
   a shared IF combiner coupled to the load network to weight and combine outputs of the load network to obtain a quadrature IF signal.

2. The apparatus of claim 1, wherein the shared IF combiner includes a plurality of summing resistors each having a programmable weight based on a value of N.

3. The apparatus of claim 2, wherein each of the plurality of summing resistors includes a plurality of unit resistors configured in parallel and switchable between an input node and an output node based on the programmable weight.

4. The apparatus of claim 1, wherein the load network includes a plurality of loads each to be individually controlled to receive one of the multi-phase IF signals.

5. The apparatus of claim 4, wherein for a given value of N, at least one of the plurality of loads is disabled.

6. The apparatus of claim 4, wherein for a given value of N, at least some of the plurality of loads are configured to receive the same phase of the N multi-phase IF signals.

7. The apparatus of claim 1, wherein at least one of the mixer stages is configured to operate at a plurality of values of N based on the desired channel frequency.

8. The apparatus of claim 1, wherein each mixer stage includes a counter to generate a first pulse signal and a shift register coupled to receive the first pulse signal and the divided master clock and to output N rotational pulse signals of a first phase and a second phase.

9. An apparatus comprising:
a plurality of mixer stages each including:
a master radio frequency (RF) device to receive an incoming RF signal and provide an RF current, the master RF device comprising at least one transconductor;
a master local oscillator (LO) device coupled to an output of the master RF device, the master LO device to receive the RF current and mix the RF current with a master clock signal to obtain a mixed signal, wherein N is programmable based upon a frequency of a desired channel within the incoming RF signal; and
a rotating switch device coupled to the master LO device to cyclically switch the mixed signal to one of a plurality of output ports of the rotating switch device to obtain N multi-phase mixed signals;
a plurality of mixer loads each configured to be coupled to one of the plurality of output ports of an active mixer stage, each of the plurality of mixer loads to perform gaining and filtering of one of the N multi-phase mixed signals; and
a shared IF stage coupled to the plurality of mixer loads, including:
a plurality of gain stages each coupled to one of the plurality of mixer loads to weight the output of the corresponding mixer load based on the value of N and to provide an output to a summer.

10. The apparatus of claim 9, wherein the at least one transconductor is to be gated by the incoming RF signal and to pass the RF current to the master LO device, wherein the at least one transconductor comprises a single differential transconductance.

11. The apparatus of claim 10, wherein the master LO device comprises a plurality of metal oxide semiconductor field effect transistors (MOSFETs) each having a first terminal to receive the RF current from the master RF device, a gate terminal to receive the master clock signal, and a second terminal to output a downconverted signal.

12. The apparatus of claim 11, wherein the rotating switch device comprises a plurality of slices each comprising a first transistor to receive the mixed signal from the second terminal of a corresponding MOSFET of the master LO device and to output a phase of the N multi-phase mixed signal when the first transistor is enabled by a rotational pulse signal of a first phase and a second transistor to receive the mixed signal from the second terminal of another corresponding MOSFET of the master LO device and to output a phase of the N multi-phase mixed signal when the second transistor is enabled by a rotational pulse signal of a second phase.

13. The apparatus of claim 12, wherein the rotational pulse signal of the first phase is AC coupled to the first transistor with a programmable DC bias, the programmable DC bias based on a value of N.

14. The apparatus of claim 12, further comprising a clock generator to generate the rotational pulse signal of the first and second phases, the clock generator including a shift register having a programmable number of bits each to output the rotational pulse signal of the first and second phases.

15. The apparatus of claim 14, wherein each bit of the shift register includes an integrated multiplexer to selectively bypass a previous stage of the shift register based on the value of N.

16. The apparatus of claim 14, further comprising a first voltage regulator to provide a regulated voltage to the clock generator and a second voltage regulator to provide a regulated voltage to a LO used to generate the master clock signal.

17. The apparatus of claim 14, wherein the rotational pulse signal of the first and second phases is to enable the corresponding first and second transistors when no current is present in the corresponding transistor.

18. A method comprising:
receiving an incoming radio frequency (RF) signal in one of a plurality of mixer stages based on a frequency of the incoming RF signal and mixing the incoming RF signal with a master clock, the master clock corresponding to a multiplied version of a local oscillator (LO) frequency, to obtain a mixed signal;
cyclically rotating the mixed signal to at least N of a plurality of gain stages during a cycle of the LO, wherein N is programmable based upon a frequency of a desired channel within the incoming RF signal; and
summing the outputs of the plurality of the at least N gain stages to provide an output signal.

19. The method of claim 18, further comprising disabling at least some of the plurality of gain stages, wherein a value of N is less than the number of gain stages.

20. The method of claim 18, further comprising cyclically rotating the mixed signal simultaneously to at least two of the gain stages, wherein the at least two gain stages are programmed to have an equal gain.

21. The method of claim 18, further comprising sharing the plurality of gain stages by the plurality of mixer stages.

22. The method of claim 18, further comprising operating at least one of the plurality of mixer stages at a plurality of values of N based on the desired channel frequency.

* * * * *